(12) United States Patent
Hara et al.

(10) Patent No.: US 8,183,897 B2
(45) Date of Patent: May 22, 2012

(54) INTEGRATED CIRCUIT DEVICE AND ELECTRONIC APPARATUS

(75) Inventors: Tomoko Hara, Chino (JP); Yoshihiko Nimura, Hara-mura (JP)

(73) Assignee: Seiko Epson Corporation, Tokyo (JP)

( * ) Notice: Subject to any disclaimer, the term of this patent is extended or adjusted under 35 U.S.C. 154(b) by 32 days.

(21) Appl. No.: 12/697,514

(22) Filed: Feb. 1, 2010

(65) Prior Publication Data

US 2010/0194452 A1  Aug. 5, 2010

(30) Foreign Application Priority Data

Feb. 3, 2009  (JP) .................................. 2009-022711

(51) Int. Cl.
*H03L 7/00* (2006.01)
(52) U.S. Cl. .................................................... 327/142
(58) Field of Classification Search .................. 324/509; 327/198
See application file for complete search history.

(56) References Cited

U.S. PATENT DOCUMENTS

| 5,933,077 A * | 8/1999 | Vogt et al. ...................... 340/506 |
| 6,144,221 A | 11/2000 | Oshima |
| 2009/0153240 A1 * | 6/2009 | Ganz ............................. 329/369 |

FOREIGN PATENT DOCUMENTS

| JP | A-5-6966 | 1/1993 |
| JP | A 2000-077996 | 3/2000 |

* cited by examiner

*Primary Examiner* — Lincoln Donovan
*Assistant Examiner* — Daniel Rojas
(74) *Attorney, Agent, or Firm* — Oliff & Berridge, PLC

(57) ABSTRACT

An integrated circuit device includes: an internal circuit; a ground terminal; a first terminal that is provided with a first signal that becomes to be a ground level during at least a portion of a period in which the internal circuit is operating; a detection circuit that compares a voltage on the first terminal and a voltage on the ground terminal, thereby detecting an open state of the ground terminal; and a setting circuit that sets the internal circuit to a reset state or a disabled state when the open state of the ground terminal is detected by the detection circuit.

6 Claims, 7 Drawing Sheets

INTEGRATED CIRCUIT DEVICE AND ELECTRONIC APPARATUS

BACKGROUND

The entire disclosure of Japanese Patent Application No. 2009-022711, filed Feb. 3, 2009 is expressly incorporated by reference herein.

1. Technical Field

The present invention relates to integrated circuit devices and electronic apparatuses.

2. Related Art

In recent years, in order to achieve higher integration and lower power consumption of semiconductor integrated circuit devices, a plurality of LSIs with different power source voltages may be connected or circuits with different power supply voltages may be mounted on the same chip. For this reason, an input output circuit (I/O circuit) needs to be a tolerant I/O circuit that operates without any interference even when input signals with a voltage higher than the power supply voltage are inputted in its I/O terminals. Therefore, as one example of such a tolerant I/O circuit, JP-A-2000-77996 (Patent Document 1) describes a voltage tolerant circuit that may be used as an I/O circuit in which a potential that is different and higher than the power supply potential within the circuit would possibly be inputted from outside. In the I/O cell provided in the I/O unit of such a semiconductor integrated circuit device, an electrostatic protection element (an electrostatic protection diode and the like) is provided for protecting the semiconductor integrated circuit device against electrical stresses such as external electrostatic induction voltages and excess currents.

The inventor of the present invention conducted studies on behaviors of internal circuits of integrated circuit devices (IC) when the ground line (the low potential power supply line) becomes to be an open state (in a floating state) due to adhesion of dielectric foreign matters or the like. As a result, it has become clear that, even when the ground line becomes open, the internal circuit may operate because a current path that runs through the electrostatic protection diode is formed.

However, the current path is formed only when the potential on a terminal to be connected to the electrostatic protection diode (i.e., a terminal other than the ground terminal) is at L (=GND), and the current path is not formed when the potential on that terminal becomes to be H, such that the internal circuit stops operating.

In other words, it has been found that, when the ground line becomes open, the internal circuit operates when the potential on the other terminal is at L level, and the internal circuit does not operate when the same is at H level, in other words, non-regular circuit operations may occur. In this case, operation/non-operation of the internal circuit of the IC is determined by the potential on the terminal to be connected to the electrostatic protection diode, which makes it impossible to secure the reliability of the IC.

SUMMARY

In accordance with some embodiments of the invention, for example, it is possible to prevent occurrence of inconvenience in which operation/non-operation of the internal circuit is determined according to the potential on a terminal other than the ground terminal, even when the ground line becomes to be an open state, whereby the reliability of the IC can be improved.

An embodiment of the invention pertains to an integrated circuit device including an internal circuit, a ground terminal, a first terminal that is provided with a first signal that becomes to be a ground level during at least a portion of a period in which the internal circuit is operating, a detection circuit that compares a voltage on the first terminal and a voltage on the ground terminal, thereby detecting an open state of the ground terminal, and a setting circuit that sets the internal circuit to a reset state or a disabled state when the open state of the ground terminal is detected by the detection circuit.

When an operation current (a ground current) flows through a non-regular current pass that runs through the other terminal in the state in which the ground terminal becomes to be an open state, the potential level on the ground terminal does not coincide with the normal ground potential level. Therefore, by comparing the normal ground terminal potential with the potential on the first terminal that receives an input of the first signal as a reference signal, it is possible to detect as to whether the ground terminal potential coincides with or differs from the normal ground terminal potential level (the ground level of the first signal as a reference). When the voltages are mutually different, the internal circuit is put in a reset state or a disabled state as the ground terminal is in an open state. By this, malfunction of the internal circuit can be prevented. The first signal may be at a ground level of a system independent of the ground to be supplied to the ground terminal, and may be a clock signal whose L level is a ground level.

Moreover, in accordance with a second embodiment, an integrated circuit device includes a second terminal and an I/O cell that receives a second signal inputted through the second terminal, wherein the I/O cell includes an electrostatic protection element provided between the second terminal and the ground, and the second signal is a signal that becomes a ground level for at least a part of the period in which the internal circuit operates.

If the second terminal becomes a ground level when the ground terminal is in an open state, the second terminal functions as a tentative ground terminal, thereby forming a non-regular current path that runs through the electrostatic protection element (including an electrostatic protection diode or the like) included in the I/O cell, causing an operation current (a ground current) to flow. Even in such a case, the detection circuit reliably detects the open state of the ground terminal, which is accompanied by setting of the internal circuit to the reset state (disabled state), whereby malfunction of the internal circuit is reliably prevented.

Also, in accordance with another embodiment of the invention, the detection circuit includes a voltage comparator circuit having a first transistor of a first conductivity type having a control node that receives a voltage on the first terminal, a second transistor of the first conductivity type having a control node that receives a voltage on the ground terminal and forming a differential pair with the first transistor, a current mirror circuit that is a load of the differential pair composed of the first transistor and the second transistor, and a third transistor as a current source transistor that supplies an operation current to the differential pair and the current mirror circuit.

By using the voltage comparator circuit composed of the differential pair transistors, the current mirror load and the current source transistor as a detection circuit, the open state of the ground terminal can be reliably detected with a compact circuit.

Also, another embodiment of the invention pertains to an integrated circuit device, wherein the setting circuit has a latch circuit that retains the level of an operation state control signal for setting the internal circuit to a reset state or a disabled state upon detection of the open state of the ground terminal by the detection circuit to an active level in a period in which the internal circuit is in an enabled state.

When the open state of the ground terminal is detected even once during operation of the internal circuit, it is preferred to retain the reset state or the disabled state while the internal circuit is set in an enabled state by an enable signal. Therefore, in accordance with the present embodiment, there is provided the latch circuit that retains the level of the operation state control signal for setting the internal circuit to a reset state or a disabled state to an active level while the internal circuit is in an enabled state. By this, when the internal circuit is placed in a reset state upon detection of the open state of the ground terminal, regardless of the state of the ground terminal thereafter, the internal circuit always cannot operate, such that malfunction of the internal circuit is reliably prevented.

Also, another embodiment of the invention pertains to an integrated circuit device that further includes an enable terminal for inputting an enable signal for switching between enabling and disabling the internal circuit, wherein, when the enable signal changes from an active level to a non-active level thereby changing the internal circuit from an enabled state to a disabled state, the latch circuit is also reset.

When the enable signal becomes non-active and the internal circuit turns to a disabled state, there is no possibility for the internal circuit to malfunction, and therefore the latch circuit provided in the setting circuit is reset at the same timing.

Furthermore, another embodiment of the invention pertains to an integrated circuit device, wherein the first terminal is a clock terminal that receives a clock signal as the first signal.

By using the clock signal whose L level is a ground level as the first signal (a reference for voltage comparison), there is no need to prepare a reference signal separately, which is practically advantageous.

Also, another embodiment of the invention pertains to an electronic apparatus that includes any one of the integrated circuit devices described above.

The integrated circuit device in accordance with the invention is highly reliable as it includes the voltage tolerance structure, and thus has a high electrostatic damage tolerance margin, and well accommodates incidents at the time of ground open state. Accordingly, the reliability of electronic apparatuses in which the integrated circuit device in accordance with the present embodiment is mounted is likewise improved.

DESCRIPTION OF EXEMPLARY EMBODIMENTS

Preferred embodiments of the invention are described in detail below. It is noted that the embodiments described below do not unduly limit the content of the invention recited in the scope of the claimed invention, and all of the compositions to be described in the embodiments may not necessarily be indispensable as means for solution provided by the invention.

1. Explanation of Phenomenon of Occurrence of Malfunction of Internal Circuit

The invention has been conceived based on the knowledge and experience of the inventor about a phenomenon that caused a problem of circuit malfunction when a ground terminal became open, which was identified by the inventor of the invention. Accordingly, prior to starting the description of compositions and operations of integrated circuit devices in accordance with embodiments of the invention, circuits examined by the inventor prior to the invention, and causes of the problems that occurred when a ground terminal become open will be described.

Figure 1A:
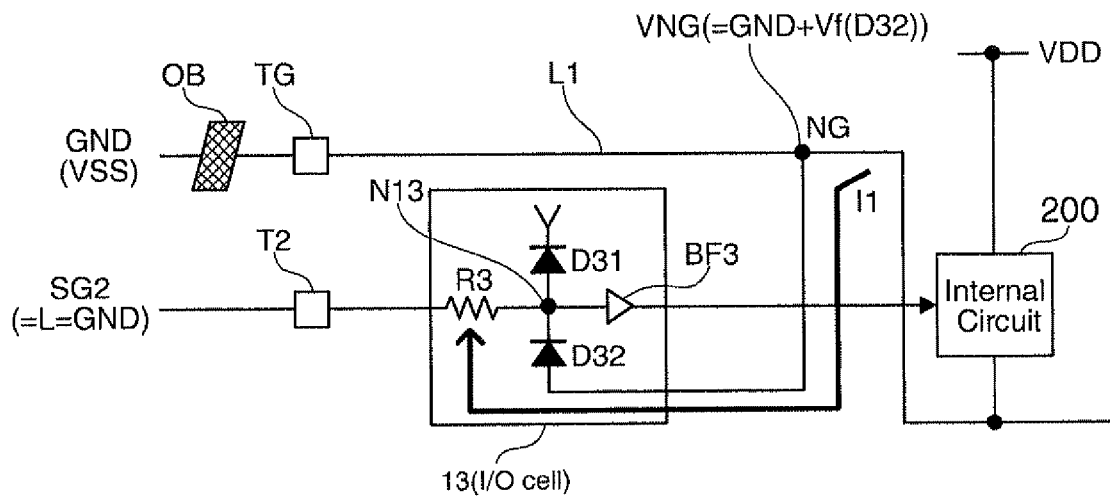
FIGS. 1A and 1B are diagrams for explaining a phenomenon in which malfunction of an internal circuit occurs with ground open.
Figure 1B:
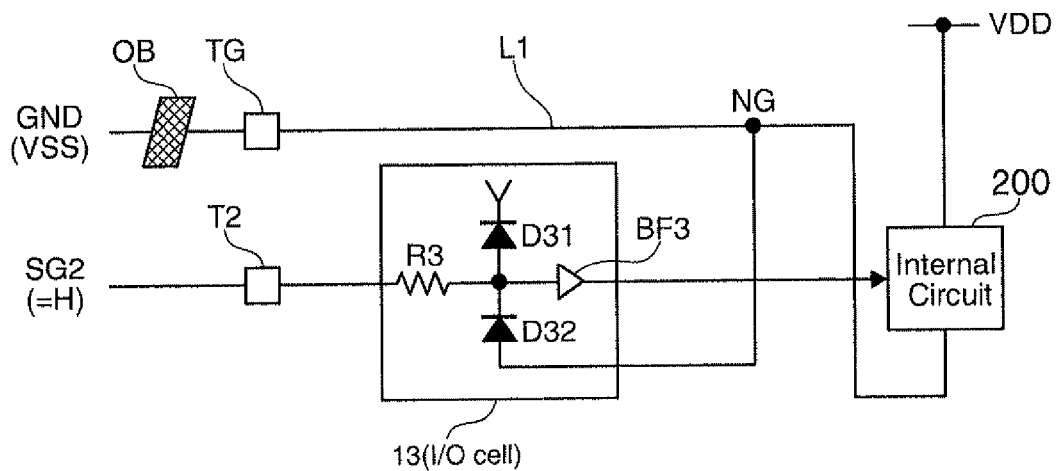

Referring to FIGS. 1A and 1B, the circuits that were examined by the inventor prior to the invention and the examination results are described.

Electrostatic protection elements (electrostatic protection diodes D31 and D32, a current control resistor R3 and the like) are provided in an I/O cell 13 that is provided at an I/O section of an integrated circuit device for protecting the integrated circuit device, its internal circuit and the like against electrical stresses such as external electrostatic induction voltage and excess current. Also, BF3 in the drawing indicates an input buffer for signal input.

Therefore, even when the power supply becomes open due to adhesion of dielectric substance OB or the like onto a ground terminal TG that is an input terminal of the ground which is a low potential side power supply source, if a signal SG2 supplied to a terminal T2 that is connected to the electrostatic protection diode D32 is at L level (ground level), as shown in FIG. 1A, the terminal T2 functions as a tentative ground terminal whereby an operation current (a ground current) I1 may flow. In this case, the potential on the ground line L1 becomes to be GND+Vf (D32) (where Vf (D32) is a normal direction voltage of the electrostatic protection diode D32). However, when Vf (D32) is as low as about several hundred mV, the potential on the ground line L1 does not elevate very much, and therefore the internal circuit 200 may operate.

On the other hand, as shown in FIG. 1B, when the signal SG2 to be supplied to the terminal T2 is at H level (for example, at VDD level), a non-regular current path is not formed. Therefore, the internal circuit 200 does not operate.

In the case described above, operation or non-operation of the internal circuit of the IC is determined by the potential on the terminal T2 that is connected to the electrostatic protection diode D32, which makes it impossible to secure the reliability of the IC.

2. Integrated Circuit Device 2.1. First Embodiment

Figure 2:
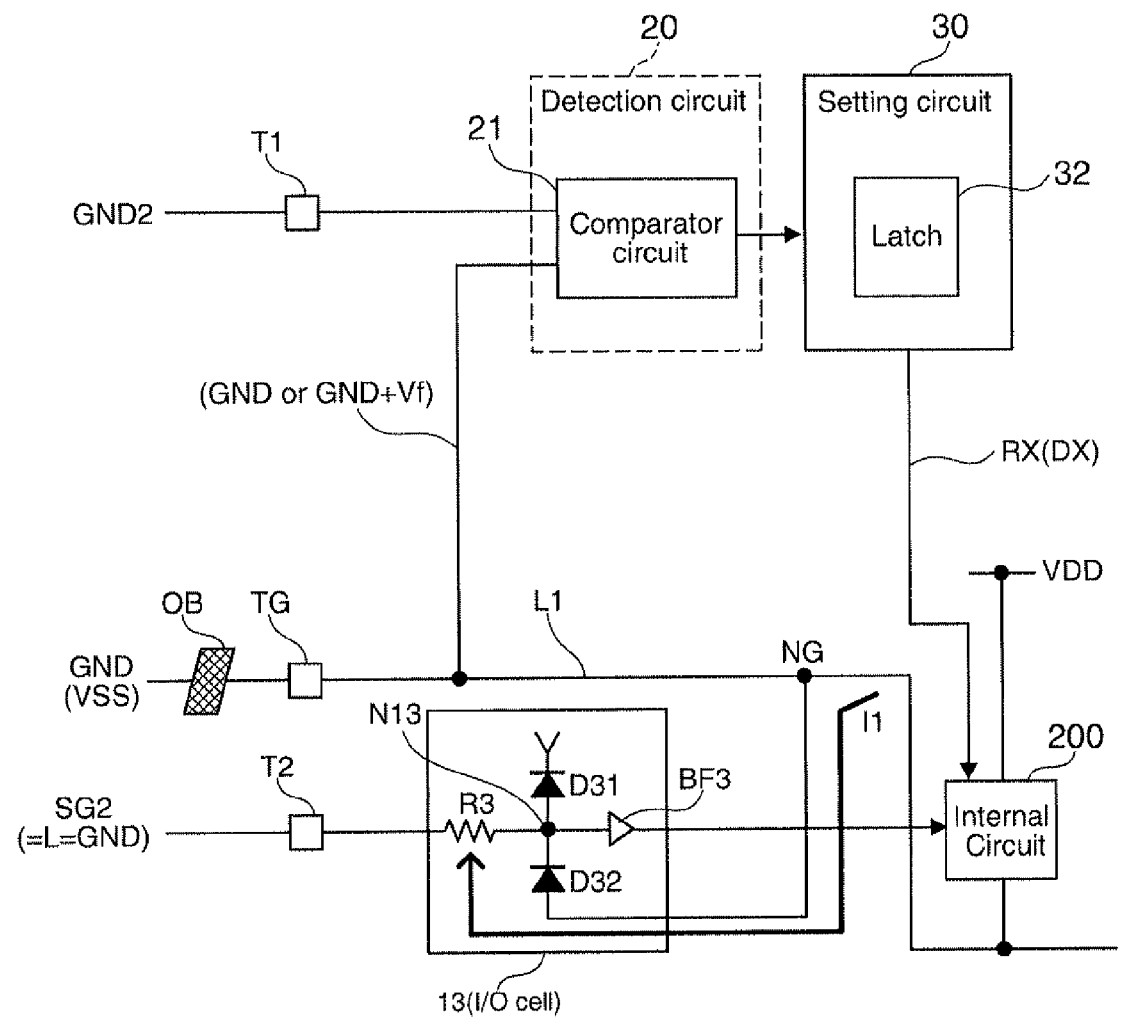
FIG. 2 is a diagram showing the composition of a main part of an integrated circuit device in accordance with a first embodiment of the invention.

FIG. 2 is a diagram showing the structure of an integrated circuit device in accordance with the first embodiment of the invention, and shows an example of a base structure of the integrated circuit device of the invention. FIG. 2 shows a detection circuit 20 having a comparator circuit 21, and a setting circuit 30 that includes a latch circuit 32.

In the state in which the ground terminal is in an open state, and when an operation current (a ground current) flows through a non-regular current path that runs through the other terminal T2 different from the ground terminal TG, the voltage level on the ground terminal TG does not coincide with the regular ground level (GND). In other words, the voltage level rises by a normal direction voltage Vf (D32) of the electrostatic protection diode D32. Accordingly, by comparing the potential on the normal ground terminal TG with the potential on the first terminal T1 to which the first signal (GND2) is inputted as a reference signal, it is possible to detect as to whether the potential on the ground terminal TG coincides with or different from the normal ground level (the ground level of the first signal GND2 as a reference).

The voltage comparison is executed by the comparator circuit 21 included in the detection circuit 20. If the voltage comparison result indicates that the voltages are different (in other words, the potential on the ground terminal TG is higher than the ground level of the first signal GND2 as a reference), the ground terminal TG is in an open state. Therefore, in this case, the setting circuit 30 outputs a reset signal RX or a disable setting signal DX to the internal circuit 200, thereby setting the internal circuit 200 to a reset state or a disabled state. It is noted that the setting circuit 30 functions to set the operation state of the internal circuit 200.

By this, malfunction of the internal circuit 200 is prevented. The first signal (GND 2) that functions as a reference at the time of voltage comparison may be a ground (GND 2) of an system independent of the ground (GND) to be supplied to the ground terminal TG, and may be a clock signal or the like whose L level is a ground level.

Also, the setting circuit 30 includes the latch circuit 32 that retains the voltage level of an operation state control signal (RX or DX described above) for setting the internal circuit 200 to a reset state or a disabled state upon detection of the open state of the ground terminal TG by the detection circuit 20 to an active level in a period in which the internal circuit 200 is in an enabled state (in other words, an operable state).

In other words, when the open state of the ground terminal TG is detected even once while the internal circuit 200 is operating, it is preferred to retain the reset state or the disabled state while the internal circuit 200 is set in an enabled state. Therefore, in the example shown in FIG. 2, there is provided the latch circuit 32 that retains the voltage level of the operation state control signal (RX or DX) for setting the internal circuit 200 to a reset state or a disabled state to an active level while the internal circuit 200 is in an enabled state. By this, when the internal circuit 200 is placed in a reset state upon detection of the open state of the ground terminal TG, regardless of the state of the ground terminal TG thereafter, the internal circuit 200 always cannot be operated, such that malfunction of the internal circuit 200 is reliably prevented.

2.2. Second Embodiment

Figure 3:
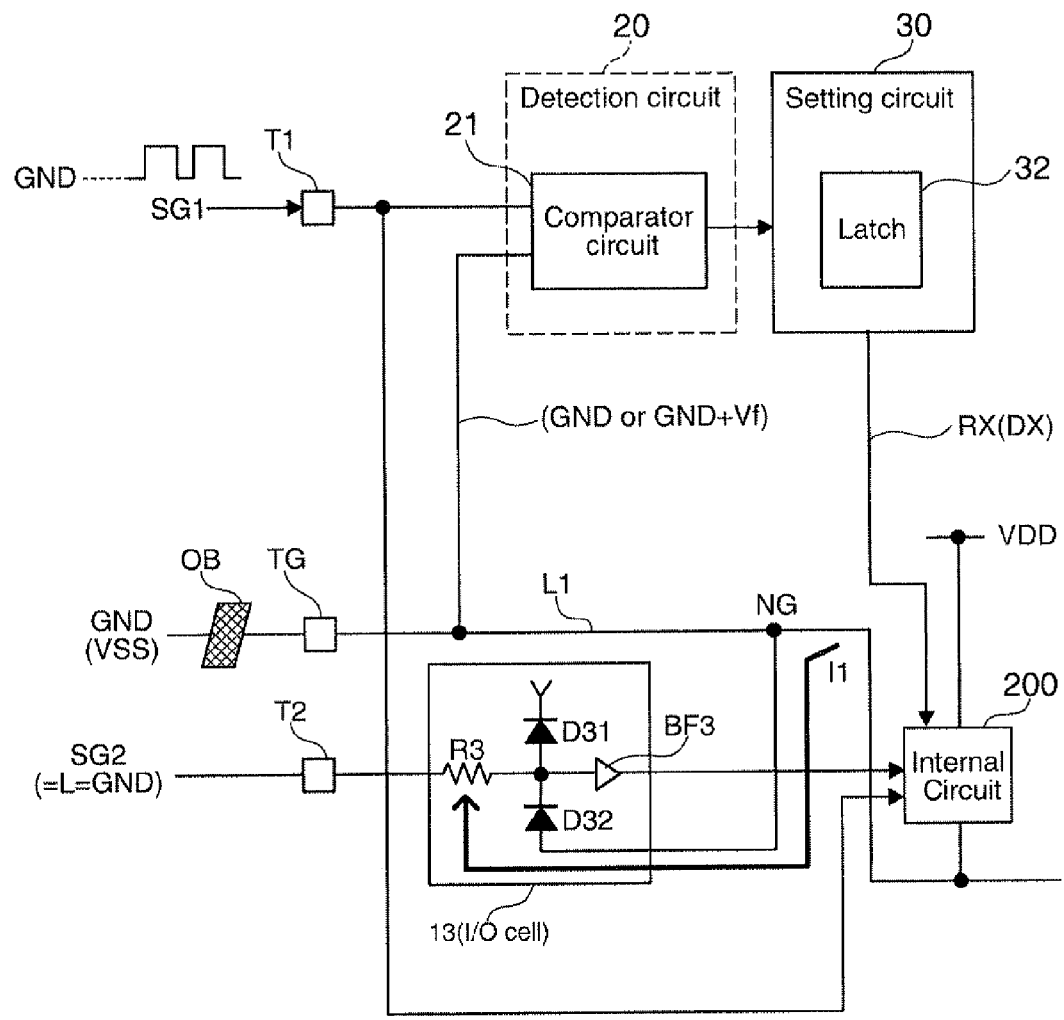
FIG. 3 is a diagram showing the composition of a main part of an integrated circuit device in accordance with a second embodiment of the invention.

FIG. 3 shows a second embodiment of an integrated circuit device in accordance with the invention. The embodiment shown in FIG. 3 uses a clock signal SG1 whose L level is a ground level as a first signal to be used as a reference for voltage comparison by the comparator circuit 21. In other words, in FIG. 3, the first terminal T1 is a clock terminal in which the clock signal SG1 as the first signal is inputted.

By using the clock signal SG1 whose L level is a ground level as the first signal (a reference for voltage comparison), a special reference signal does not need to be prepared separately, which is practically advantageous.

2.3. Third Embodiment

Figure 4:
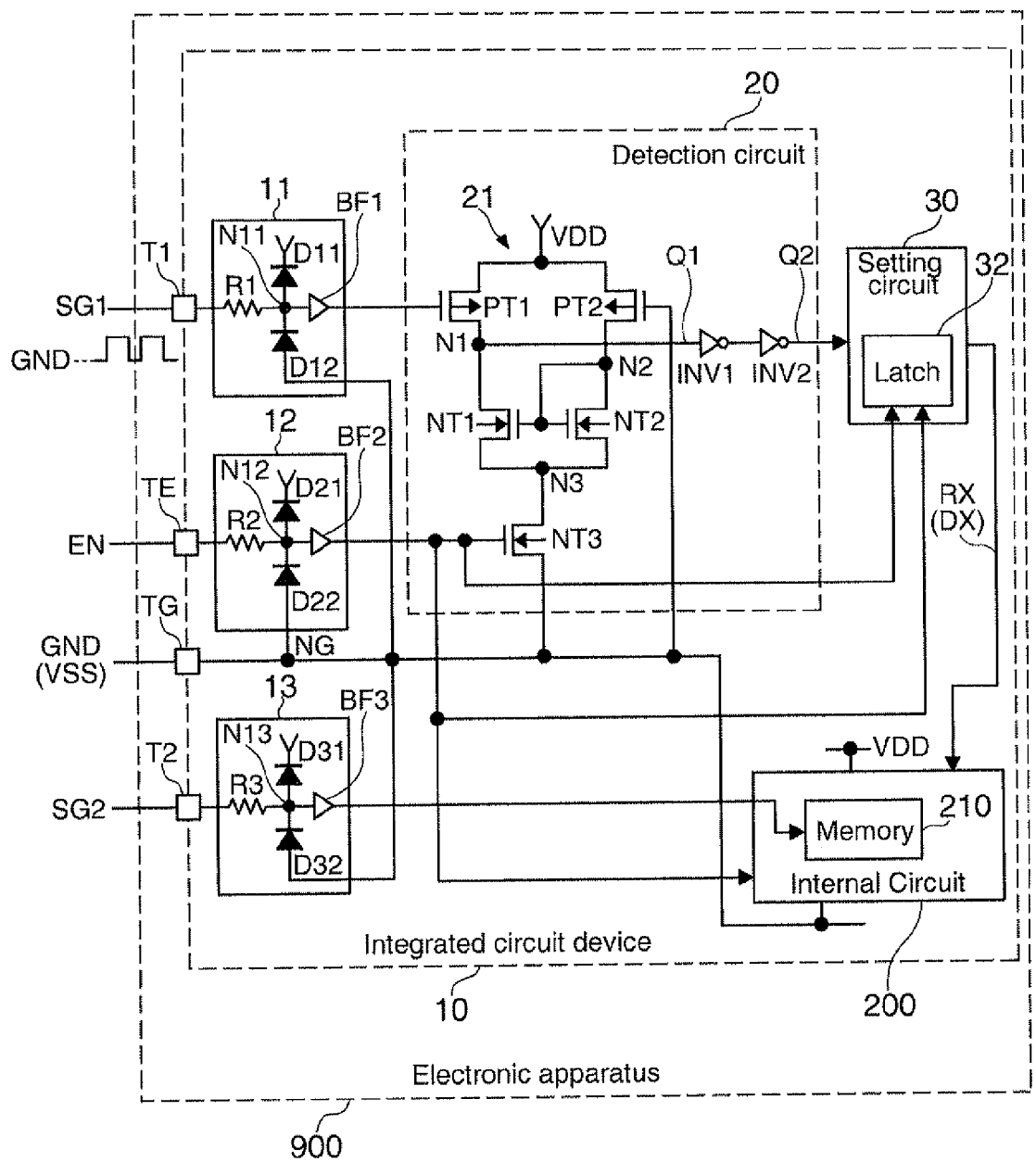
FIG. 4 is a concrete diagram of the composition of a main part of an integrated circuit device in accordance with a third embodiment of the invention.

FIG. 4 shows a third embodiment of an integrated circuit device in accordance with the invention. In addition to the first signal terminal T1 and the ground terminal TG, the embodiment shown in FIG. 4 is provided with an enable terminal TE in which an enable signal EN is inputted, and a second terminal T2 in which a second signal SG2 is inputted. The internal circuit 200 is switched between enabling and disabling by the enable signal EN. By this, the power consumption of the internal circuit 200 can be reduced. Moreover, the enable signal EN is also supplied to the latch circuit 32 within the setting circuit 30. When the enable signal EN becomes nonactive, and the internal circuit 200 is thus put in a disabled state, there is no possibility for the internal circuit 200 to malfunction, and therefore the latch circuit provided in the setting circuit is also reset at the same timing.

Also, the second signal SG2 is a signal that becomes to be a ground level in at least a part of the period in which the internal circuit 200 is operating (the period in which it is made operable by the enable signal). In the composition shown in FIG. 4, the second signal SG2 is write data to a memory 210 provided in the internal circuit 200. The write data being 0 (L) corresponds to a ground level.

Also, at the input sections for the respective signals, as shown in FIG. 4, I/O cells 11-13 equipped with electrostatic protection circuits are provided. The composition of each of the I/O cells 11 and 12 is the same as the composition of the I/O cell 13 described above.

Also, the detection circuit 20 shown in FIG. 4 includes voltage comparator circuit 21 formed from differential pair transistors, a current mirror, and current source transistors and the like. In other words, the voltage comparator circuit 21 includes a first transistor PT1 of a first conductivity type (P type) having a control node (a gate) in which the voltage on the first terminal T1 is supplied, a second transistor PT2 of the first conductivity type (P type) having a control node (a gate) in which the voltage on the ground terminal TG is supplied, and forming a differential pair with the first transistor PT1, a current mirror circuit (composed of N-type third and fourth transistors NT1 and NT2) that is a load of the differential pair composed of the first transistor PT1 and the second transistor PT2, and a fifth transistor (N-type transistor) NT3 as a current source transistor that supplies an operation current for the differential pair and the current mirror circuit. As the voltage comparator circuit 21 formed from the differential pair transistors, the current mirror load and the current source transistors is used as the detection circuit 20, the open state of the ground terminal can be reliably detected with a compact circuit. It is noted that a single end detection output Q1 can be obtained from the voltage comparator circuit 21, and the detection output Q1 is outputted as a detection output Q2 through inverters INV1 and INV2 as an output buffer.

Figure 5A:
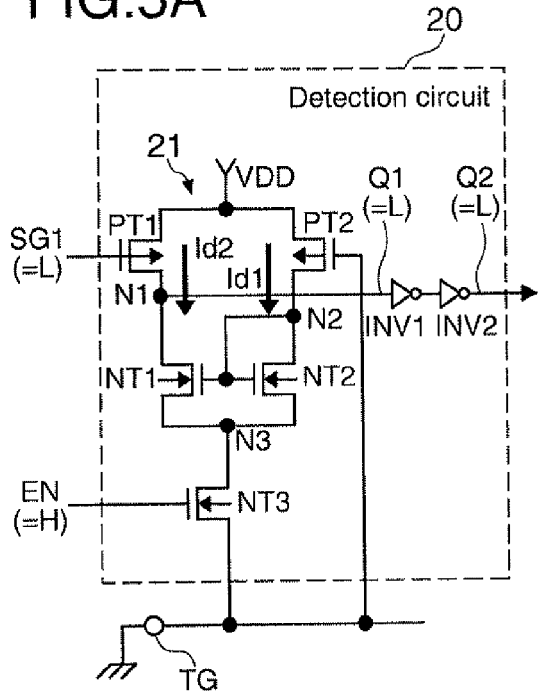
FIGS. 5A-5C are diagrams for explaining operations of a detection circuit shown in FIG. 4.
Figure 5B:
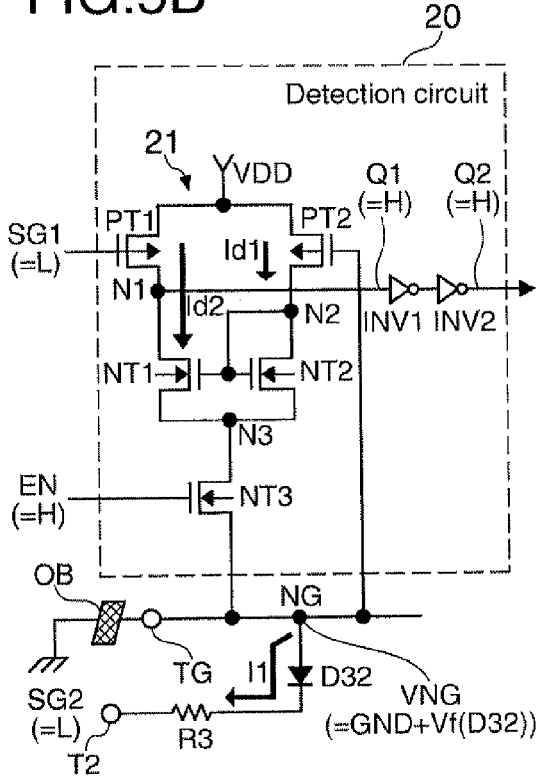
Figure 5C:
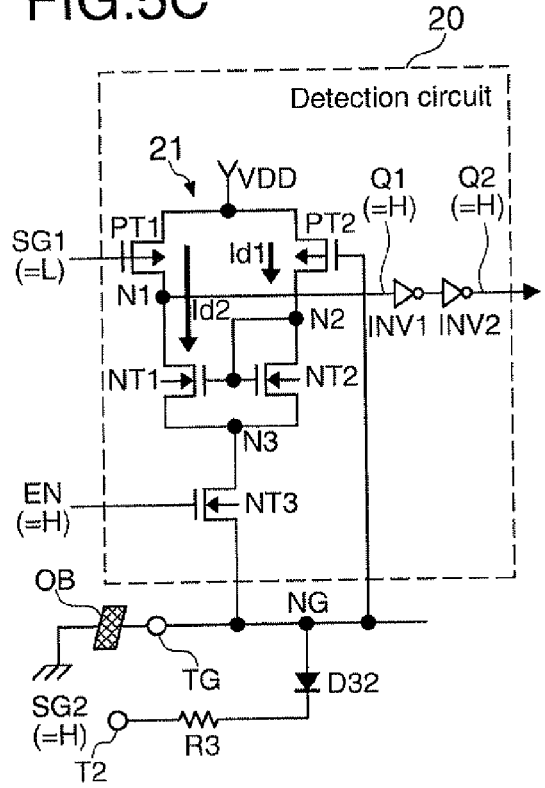
Figure 6:
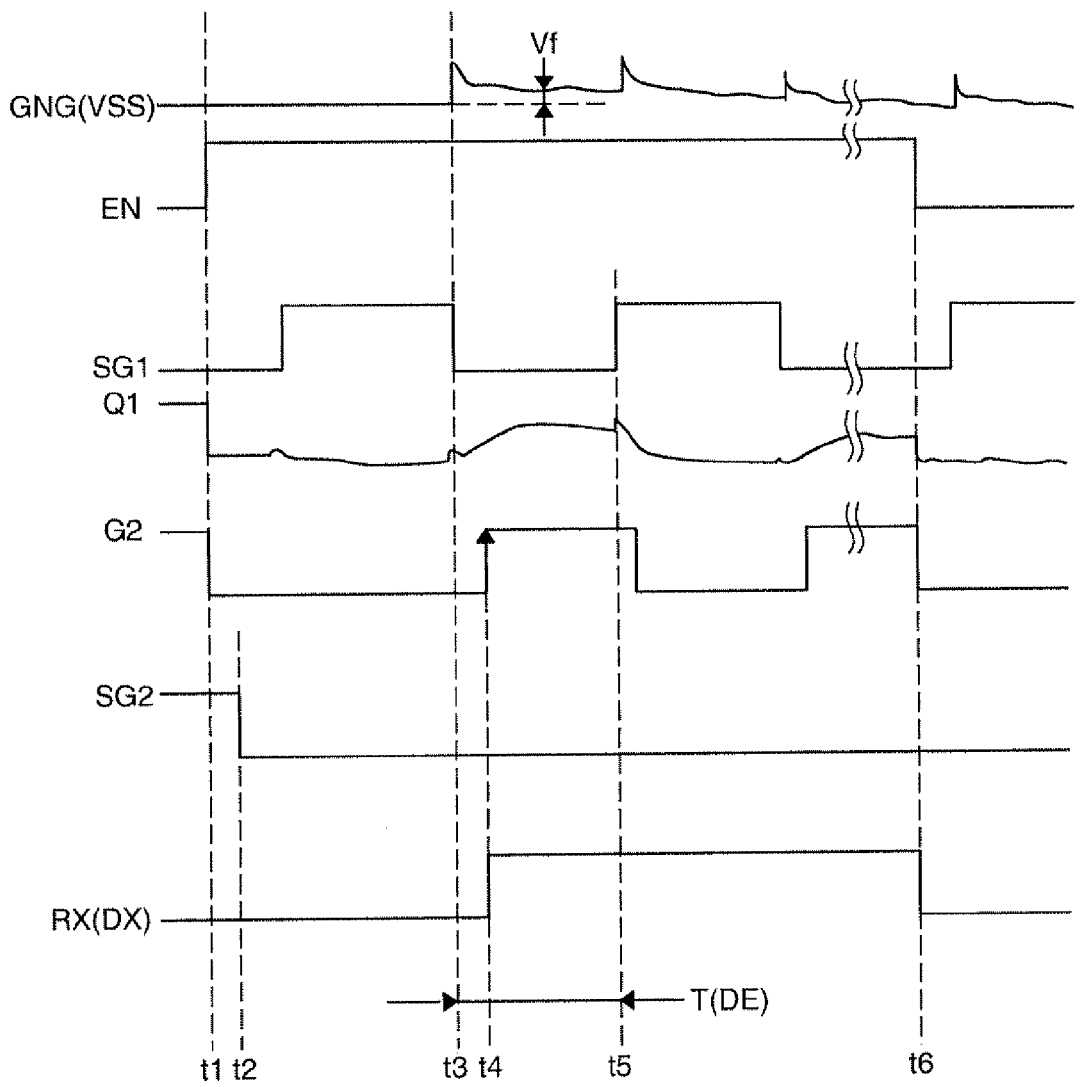
FIG. 6 shows a timing chart for explaining operations of the detection circuit and a setting circuit shown in FIG. 4.

FIGS. 5A-5C are diagrams for explaining operations of the detection circuit 20 shown in FIG. 4. In FIG. 5A, the ground terminal TG is not in an open state, the same amount of current Id2 and Id1 flows to the differential transistors PT1 and PT2, respectively, whereby the differential circuit is balanced, and the detection outputs Q1 and Q2 become L level (in other words, the differential circuit is composed to output L in a balanced state).

In FIG. 5B, as described above, the ground terminal TG becomes to be an open state due to deposited dielectric substance OB or the like, and the second signal SG2 becomes to be L level, whereby a non-regular current path is formed and an operation current I1 flows. In this case, the voltage level on the ground terminal TG is elevated by a normal direction voltage of the diode D32, whereby the differential circuit becomes imbalance between the left and right sides, resulting in Id2>Id1. Therefore, the detection outputs Q1 and Q2 invert to H level, whereby the open state of the ground terminal TG is detected.

Also, in FIG. 5C, the ground terminal TG becomes to be an open state due to deposition of dielectric substance OB or the like, and the second signal SG2 is at H level, whereby an operation current (a ground current) cannot flow. Therefore, the detection circuit 20 cannot operate normally. However, as a high potential power supply voltage VDD is applied to the detection circuit 20, the detection outputs Q1 and Q2 consequently become H level.

It is understood from FIG. 5B and FIG. 5C that, when the ground terminal TG becomes to be an open state, it is possible to reliably detect the ground being open, as the detection outputs Q1 and Q2 maintain H level.

FIG. is a chart for describing operations of the circuit shown in FIG. 4. At time t1, the enable signal EN changes from L level to H level (active level), the internal circuit 200 becomes to be an enable state (an operable state). Also, when the level of the second signal supplied to the second terminal T2 changes, for example, from H to L at time t2. If the ground terminal TG is in an open state, the level on the ground terminal TG is in a floating state. However, as described above, for example, a current path is formed through the electrostatic protection diode, its potential tends to elevate. As described earlier, during the period in which the first signal SG1 that functions as a reference at the voltage comparator circuit is at L level, the voltage level of the ground terminal TG can be compared with the ground level as a reference. Accordingly, the period in which the first signal SG1 is at L level is a detection period (T (DE)). At time t4, the detection output Q2 inverts to H level. At the timing of time t4, the detection result is retained at the latch circuit 32 within the setting circuit 30. Therefore, at time t4, the reset signal DX (or the disable signal DX) for the internal circuit 200 becomes an active level. At time 66, as the enable signal EN becomes a non-active level (L), the reset signal DX (or the disable signal DX) for the internal circuit 200 also becomes non-active.

2.4. Fourth Embodiment

Figure 7:
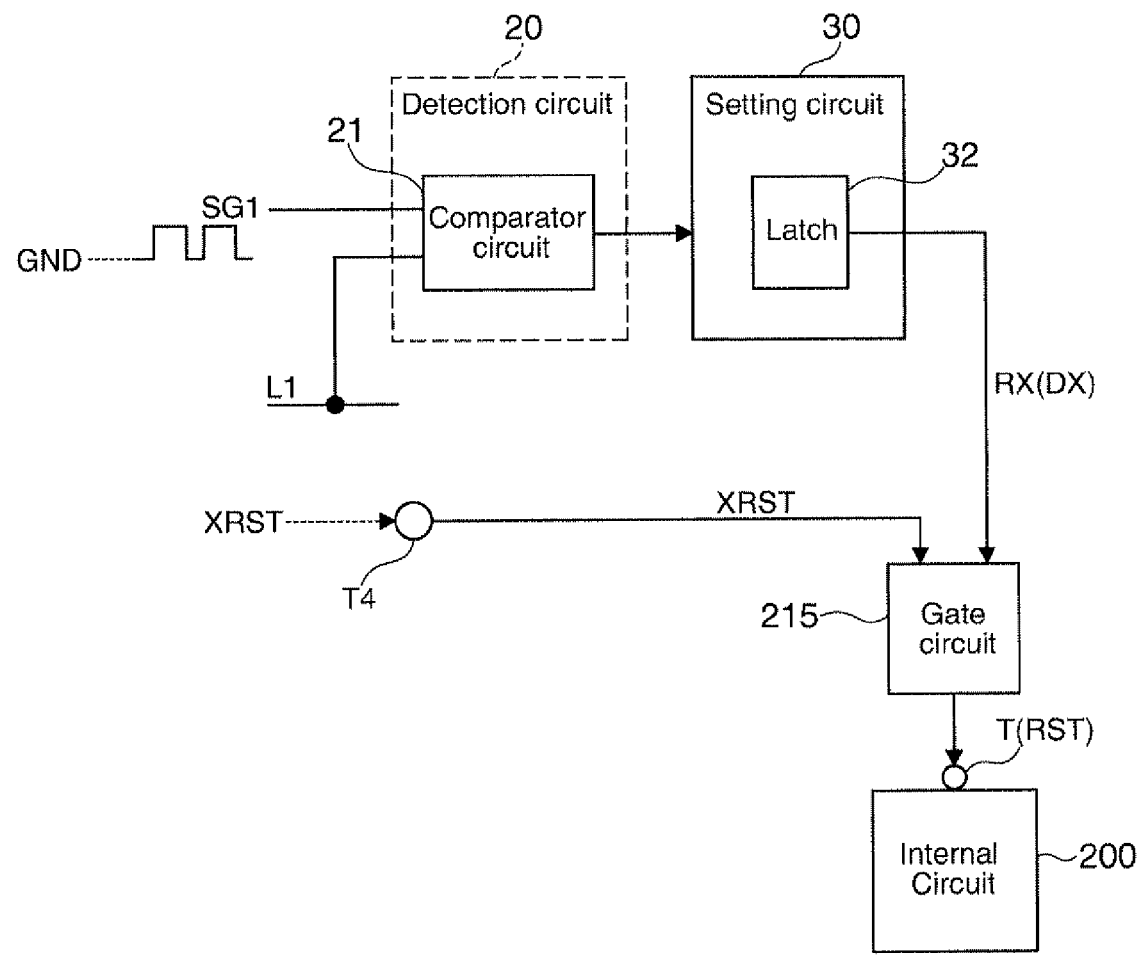
FIG. 7 is a diagram showing the composition of a main part of an integrated circuit device in accordance with a fourth embodiment of the invention.

FIG. 7 is a diagram showing a main composition of an integrated circuit device in accordance with a fourth embodiment of the invention. As shown in FIG. 7, a reset signal XRST can be inputted from outside to the IC through a terminal T4. Also, the internal circuit 200 has an internal reset terminal T (RST) that receives the reset signal.

Also, the reset signal XRST supplied from outside, and a reset signal DX (or a disable signal DX) outputted from the setting circuit 30 are inputted in the internal reset terminal T (RST) of the internal circuit 200 through a gate circuit 215. In accordance with the present embodiment, when an open state of the ground terminal TG is detected, the internal reset terminal T (RST) is used to reset the internal circuit 200. Therefore, a special internal reset terminal does not need to be provided.

3. Electronic Apparatus

As shown in FIG. 4, an electronic apparatus 900 includes an integrated circuit device (IC) 10 in accordance with an embodiment of the invention. The integrated circuit device 10 in accordance with the invention is highly reliable because it has a voltage tolerance structure, and thus has a high electrostatic damage tolerance margin, and well accommodates incidents at the time of ground open. Accordingly, the reliability of electronic apparatus 900 in which the integrated circuit device 10 in accordance with the present invention is mounted is likewise improved. The electronic apparatus 900 may be, for example, a portable type information terminal, such as, for example, a cellular phone, a PDA and the like.

Embodiments of the invention have been described above in details. However, it should be readily understood by a person having ordinary skill in the art that many modifications can be made without departing in substance from the novel matter and effects of the invention. Accordingly, all of such modification examples are deemed to be included in the scope of the invention. For example, in the specification and drawings, terms that are recited at least once with different terms in wider sense or synonymous can be replaced with the different terms anywhere else in the specification or drawings. Also, the compositions and operations of the integrated circuit devices and electronic apparatuses are not limited to those described in the embodiments, and many modifications can be implemented.

What is claimed is:

1. An integrated circuit device comprising:
   an internal circuit;
   a ground terminal;
   a first terminal that is provided with a first signal that becomes to be a ground level during at least a portion of a period in which the internal circuit is operating, the first terminal being a clock terminal that receives a clock signal as the first signal;
   a detection circuit that compares a voltage on the first terminal and a voltage on the ground terminal, thereby detecting an open state of the ground terminal; and
   a setting circuit that sets the internal circuit to a reset state or a disabled state when the open state of the ground terminal is detected by the detection circuit.

2. An integrated circuit device according to claim 1, further comprising:
   a second terminal and an I/O cell that receives a second signal inputted through the second terminal,
   wherein the I/O cell includes an electrostatic protection element provided between the second terminal and the ground, and the second signal is a signal that becomes a ground level for at least a part of a period in which the internal circuit operates.

3. An integrated circuit device according to claim 1, wherein the detection circuit includes a voltage comparator circuit having
   a first transistor of a first conductivity type having a control node that receives a voltage on the first terminal,
   a second transistor of the first conductivity type having a control node that receives a voltage on the ground terminal and forming a differential pair with the first transistor,
   a current mirror circuit that is a load of the differential pair composed of the first transistor and the second transistor, and a third transistor as a current source transistor that supplies an operation current to the differential pair and the current mirror circuit.

4. An electronic apparatus that includes the integrated circuit device recited in claim 1.

5. An integrated circuit device according to claim 1, wherein the setting circuit has a latch circuit that retains the level of an operation state control signal for setting the internal circuit to a reset state or a disabled state upon detection of the open state of the ground terminal by the detection circuit to an active level in a period in which the internal circuit is in an enabled state.

6. An integrated circuit device according to claim 5, further comprising an enable terminal for inputting an enable signal for switching between enabling and disabling the internal circuit, wherein, when the enable signal changes from an active level to a non-active level thereby changing the internal circuit from an enabled state to a disabled state, the latch circuit is also reset.

\* \* \* \* \*